United States Patent
Liu et al.

(10) Patent No.: US 10,978,539 B2
(45) Date of Patent: Apr. 13, 2021

(54) ARRAY SUBSTRATE HAVING A RECESSED AND LIGHT BLOCKING PORTION AND FABRICATION METHOD THEREOF, AND DISPLAY DEVICE

(71) Applicants: Hefei Xinsheng Optoelectronics Technology Co., Ltd., Hefei (CN); BOE TECHNOLOGY GROUP CO., LTD., Beijing (CN)

(72) Inventors: Jun Liu, Beijing (CN); Liangchen Yan, Beijing (CN); Bin Zhou, Beijing (CN); Jun Wang, Beijing (CN); Tongshang Su, Beijing (CN); Biao Luo, Beijing (CN); Yang Zhang, Beijing (CN)

(73) Assignees: Hefei Xinsheng Optoelectronics Technology Co., Ltd., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 46 days.

(21) Appl. No.: 16/456,619

(22) Filed: Jun. 28, 2019

(65) Prior Publication Data

US 2020/0075704 A1 Mar. 5, 2020

(30) Foreign Application Priority Data

Aug. 30, 2018 (CN) .......................... 201811004829.3

(51) Int. Cl.
*H01L 27/32* (2006.01)
*H01L 51/56* (2006.01)

(52) U.S. Cl.
CPC ...... *H01L 27/3272* (2013.01); *H01L 27/3246* (2013.01); *H01L 27/3258* (2013.01); *H01L 51/56* (2013.01)

(58) Field of Classification Search
CPC combination set(s) only.
See application file for complete search history.

(56) References Cited

U.S. PATENT DOCUMENTS

| 2008/0020500 | A1 | 1/2008 | Park et al. | |
|---|---|---|---|---|
| 2009/0039773 | A1* | 2/2009 | Jun | H01L 27/3258 313/504 |
| 2012/0094472 | A1* | 4/2012 | Yoo | H01L 27/1288 438/478 |

(Continued)

FOREIGN PATENT DOCUMENTS

| CN | 104022129 | 9/2014 |
|---|---|---|
| CN | 106601754 | 4/2017 |

(Continued)

OTHER PUBLICATIONS

1st Office Action dated Jun. 1, 2020 for Chinese Patent Application No. 201811004829.3.

*Primary Examiner* — Nduka E Ojeh
(74) *Attorney, Agent, or Firm* — Thomas Horstemeyer, LLP

(57) ABSTRACT

An array substrate includes a base substrate, a transistor on the base substrate, a planarization layer on a side of the transistor away from the base substrate, a recessed portion on the planarization layer, and a light blocking portion in the recessed portion. The light blocking portion is configured to prevent a light from being incident upon an active layer.

20 Claims, 4 Drawing Sheets

(56) References Cited

U.S. PATENT DOCUMENTS

2014/0361265 A1* 12/2014 Liu .................... H01L 51/5271
                                                                                          257/40
2019/0006626 A1* 1/2019 Kim .................... H01L 27/322

FOREIGN PATENT DOCUMENTS

| CN | 107068725 | 8/2017 |
| CN | 107968110 | 4/2018 |

* cited by examiner

ARRAY SUBSTRATE HAVING A RECESSED AND LIGHT BLOCKING PORTION AND FABRICATION METHOD THEREOF, AND DISPLAY DEVICE

CROSS-REFERENCE TO RELATED APPLICATION

This application is based upon, and claims the benefit of and priority to, Chinese Patent Application No. 201811004829.3, filed on Aug. 30, 2018, the entire contents thereof are incorporated herein by reference.

TECHNICAL FIELD

The present disclosure generally relates to the field of display technologies and, more particularly, to an array substrate and a fabrication method thereof, and a display device.

BACKGROUND

Organic light emitting diode (OLED) displays have been widely used in electronic devices, including electronic products, such as computers, mobile phones and so on, due to their advantages of self-light emission, slim design, low power consumption, high contrast, wide color gamut, flexible display, etc.

For OLED display panels, stability of driving transistors in pixel driving circuits plays a particularly important role in the quality of a display screen. Especially for bottom emission type display panels, the OLEDs are far away from base substrates with respect to driving transistors, which causes light emitted from the OLEDs to be easily incident upon the driving transistors, resulting in a decrease in stability and having an adverse effect on display.

SUMMARY

An embodiment of the present disclosure provides an array substrate that includes a base substrate, a transistor on the base substrate, a planarization layer on a side of the transistor away from the base substrate, a recessed portion on the planarization layer, and a light blocking portion in the recessed portion. The light blocking portion is configured to prevent a light from being incident upon an active layer.

Alternatively, the light blocking portion is entirely in the recessed portion.

Alternatively, the recessed portion is of a ring shape, a projection of the recessed portion on the substrate at least surrounding a projection of the active layer on the substrate.

Alternatively, the recessed portion is an enclosed annular groove.

Alternatively, a groove width of the enclosed annular groove ranges from 3 μm to 4 μm.

Alternatively, the light blocking portion is of a ring shape, a projection of the light blocking portion on the substrate at least surrounding a projection of the active layer on the substrate.

Alternatively, the light blocking portion is of an enclosed annular shape.

Alternatively, the array substrate comprises a plurality of sub-pixels, and at least one of the sub-pixels comprises an open region and a non-open region, the transistor is positioned in the non-open region on at least one side of the open region, and the recessed portion is positioned in the non-open region.

Alternatively, the array substrate further comprises a self-light-emitting unit positioned in the open region, the self-light-emitting unit is positioned on a side of the planarization layer away from the base substrate, and a light emission side of the self-light-emitting unit faces to a side of the base substrate.

Alternatively, the self-light-emitting unit is an organic light-emitting diode.

Alternatively, the array substrate further comprises a pixel defining layer positioned on a side of the planarization layer away from the base substrate to define the sub-pixels.

Alternatively, a part of the pixel defining layer forms at least a part of the light blocking portion.

Alternatively, the light blocking portion is mainly formed of a black light absorbing material.

Alternatively, the transistor is a driving transistor.

Alternatively, the recessed portion is arranged on four sides of the planarization layer facing to the active layer of the transistor.

Alternatively, the recessed portion constitutes an enclosed annular groove.

Alternatively, a groove width of the enclosed annular groove ranges from 3 μm to 4 μm.

Alternatively, a bottom of the recessed portion does not penetrate through the planarization layer.

Alternatively, a depth of the recessed portion accounts for 80%~95% of a thickness of the planarization layer.

Another embodiment of the present disclosure provides a method for fabricating an array substrate, comprising:

providing a base substrate;

forming a transistor on the base substrate, the transistor comprising an active layer;

forming a planarization layer on the transistor, and forming a recessed portion on the planarization layer;

forming a recessed portion on the planarization layer; and forming a light blocking portion in the recessed portion, the light blocking portion being configured to prevent a light from being incident upon the active layer.

Alternatively, the method for fabricating an array substrate further comprises forming a self-light-emitting unit on a side of the planarization layer away from the base substrate.

Alternatively, the forming a recessed portion comprises:

forming the recessed portion on at least one side of the planarization layer facing to the active layer of the transistor through a dry etch process; wherein etching gas used in the dry etch process is O2; or wherein the etching gas used in the dry etch process is mixed gas of CF4 and O2, and a volume flow rate of CF4 in the mixed gas is 5%~8%.

Alternatively, the forming a light blocking portion in the recessed portion on the planarization layer comprises: forming a pixel defining layer on the planarization layer, a part of the pixel defining layer being filled into the recessed portion, and constituting the light blocking portion.

Another embodiment of the present disclosure provides a display device comprising the array substrate according to present disclosure.

Embodiments of the present disclosure provide an array substrate and a fabrication method thereof, and a display device. The array substrate includes: a transistor positioned in each sub-pixel and a planarization layer positioned on a side of the transistor away from the base substrate. A recessed portion is arranged on at least one side of the planarization layer corresponding to an active layer of the transistor, and the recessed portion is internally provided with a light blocking portion.

BRIEF DESCRIPTION OF THE DRAWINGS

To describe the technical solutions of the embodiments of the present disclosure or that of the prior art more clearly, the accompanying drawings required for describing the embodiments or the prior art will be briefly introduced below. Understandably, the accompanying drawings in the following description are merely some embodiments of the present disclosure. To those of ordinary skills in the art, other accompanying drawings may also be derived from these accompanying drawings without creative effort.

DETAILED DESCRIPTION

Technical solutions in the embodiments of the present disclosure will be described clearly and completely below in conjunction with the accompanying drawings in the embodiments of the present disclosure. Understandably, the described embodiments are some, but not all, of the embodiments of the present disclosure. All other embodiments obtained by those of ordinary skills in the art based on the embodiments of the present disclosure without creative effort shall fall within the protection scope of the present disclosure.

Unless otherwise defined, all the technical terms or scientific terms used in the embodiments of the present disclosure have the same meanings as commonly understood by one of ordinary skill in the art, to which the present disclosure belongs. The terms "first", "second", and so on used in the embodiments of the present disclosure do not denote any sequence, quantity, or importance, but instead, are merely intended to distinguish different constituent parts. The terms "comprise" or "include" and so on are intended to specify that the elements or the objects stated before these terms encompass the elements or the objects and equivalents thereof listed after these terms, but do not preclude the other elements or objects. The terms "connect" or "connection" and so on are not limited to physical or mechanical connection, and also may include electrical connection, either directly or indirectly. "On," "under," "right," "left," and the like are only used to indicate relative position relationship and, when the absolute position of the object which is described is changed, the relative position relationship may be changed accordingly.

Embodiments of the present disclosure provide an array substrate and a fabrication method thereof, and a display device, which can solve the problem of stability degradation caused by a fact that light is incident upon an active layer of a transistor in the prior art.

Figure 1:
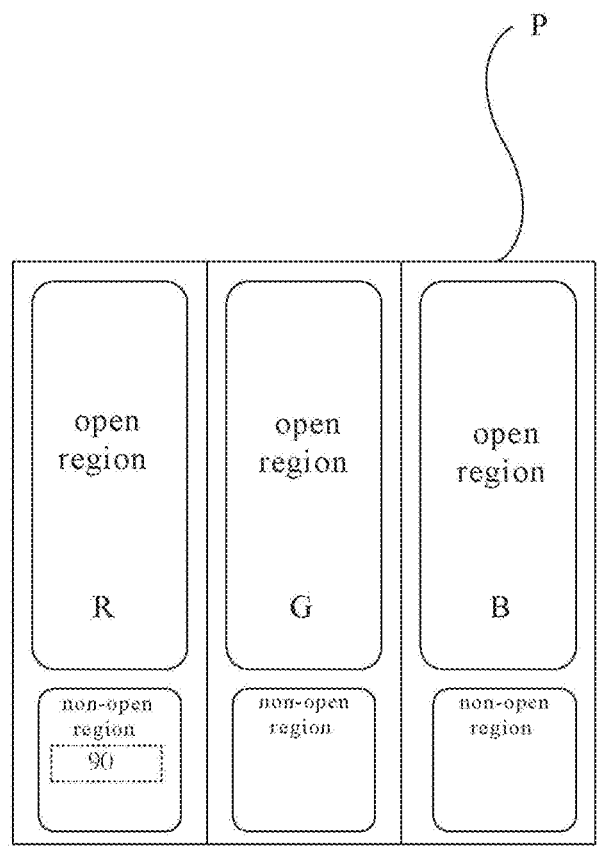
FIG. 1 is a schematic structural diagram of a pixel unit of a bottom emission type array substrate according to an embodiment of the present disclosure.

An embodiment of the present disclosure provides an array substrate. The array substrate includes a plurality of sub-pixels, each of which is provided with a transistor 90. Schematically as shown in FIG. 1, taking three sub-pixels (R, G and B) in a pixel unit of a bottom emission type array substrate as an example, each sub-pixel P includes an open region and a non-open region on at least one side of the open region. The driving transistor 90 is arranged in the non-open region of the sub-pixel P. Understandably, a self-light-emitting unit is arranged in the open region. In other embodiment, the driving transistor 90 may also be replaced by other types of translators.

Figure 2:
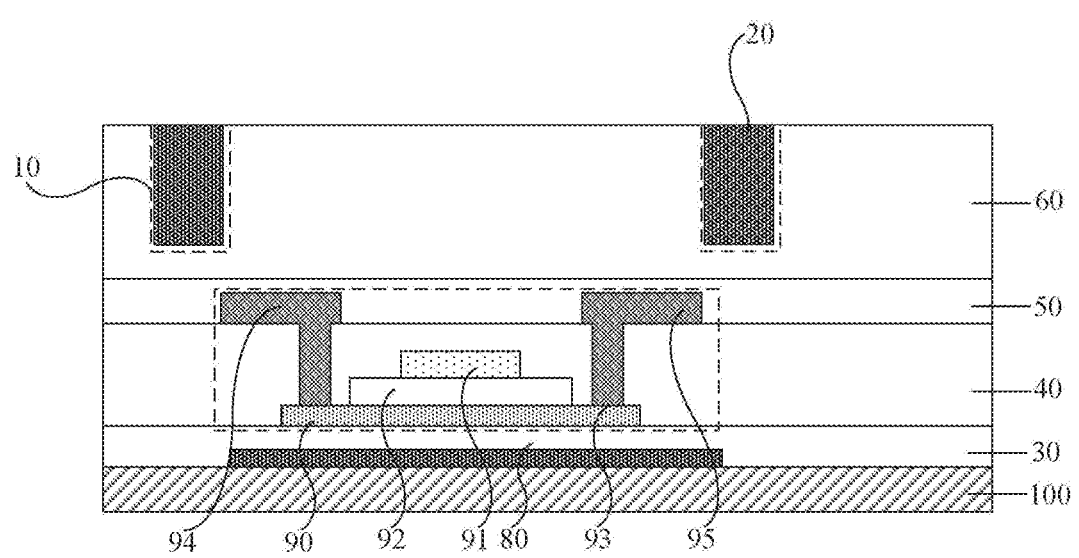
FIG. 2 is a schematic structural diagram of a bottom emission type array substrate according to an embodiment of the present disclosure.

On this basis, as shown in FIG. 2, the array substrate in the present disclosure (hereinafter referred to as the array substrate) also includes a planarization layer 60 (the planarization layer typically is formed of resin) positioned on a side of the driving transistor 90 away from the base substrate 100. A recessed portion 10 is arranged on at least one side of the planarization layer 60 facing to the active layer 93 of the driving transistor 90. In some embodiments, the recessed portion 10 is of a ring shape, a projection of the recessed portion 10 on the substrate 100 at least surrounding a projection of the active layer 90 on the substrate 100. The recessed portion 10 is internally provided with a light blocking portion 20. Understandably, the light blocking portion 20 can absorb and block light and thus, generally is formed of light-blocking materials. In some embodiments, the light blocking portion 20 is of a ring shape, for example, the light blocking portion 20 is of an enclosed annular shape. A projection of the light blocking portion 20 on the substrate 100 at least surrounds a projection of the active layer 90 on the substrate 100.

Thus, the light blocking portion positioned in the recessed portion of the planarization layer can block light on a side of the planarization layer away from the base substrate from being incident upon the active layer of the driving transistor, thereby reducing instability (such as instability of a threshold voltage, etc.) of the driving transistor caused by an illumination leakage current.

On this basis, it is to be understood that, in the present disclosure, light is blocked from being incident upon the active layer of driving transistor 90 by the light blocking portion 20 in the recessed portion 10 on the planarization layer 60 positioned on a side of the driving transistor 90 away from the base substrate 100, which is particularly applicable for a bottom emission type array substrate.

Specifically, for the bottom emission type array substrate, the recessed portion 10 is necessarily positioned in the non-open region (avoiding having an unnecessary effect on light for normal display in the open region). Furthermore, a self-light-emitting unit 210 in the bottom emission type array substrate is positioned on a side of the planarization layer 60 away from the base substrate 100, and a light emission side of the self-light-emitting unit 210 faces toward a side of the base substrate 100, thus a part of a light emitted from the self-light-emitting unit 210 faces toward the active layer of the driving transistor 90. In this way, by adopting the technical solutions of the present disclosure, a part of light emitted from the self-light-emitting unit 210 can be better blocked from being incident upon the active layer of the driving transistor 90. All the following embodiments are described by way of this example.

In addition, it is to be noted that the self-light-emitting unit 210 in the present disclosure may be either an organic light-emitting diode or a micro-light-emitting diode, or a quantum dot light-emitting diode, but the present disclosure is not limited thereto. In the present disclosure, for example, the self-light-emitting unit 210 is the organic light-emitting diode. Taking the organic light-emitting diode as an example, the above bottom emission type array substrate includes a transparent electrode and a reflective electrode arranged oppositely (understandably, a light emission functional layer is arranged between the two electrodes). The transparent electrode is closer to a side of the base substrate than the reflective electrode, and light emitted from the light emission functional layer is emitted toward a side of the base substrate through the transparent electrode.

On this basis, the specific arrangement of the recessed portion 10 is further described below.

In practice, to effectively block the light from the side of the planarization layer away from the base substrate from being incident upon the active layer of the driving transistor, as shown in FIG. 2, for example, the light blocking portion 20 is entirely filled in the recessed portion 10.

Figure 3:
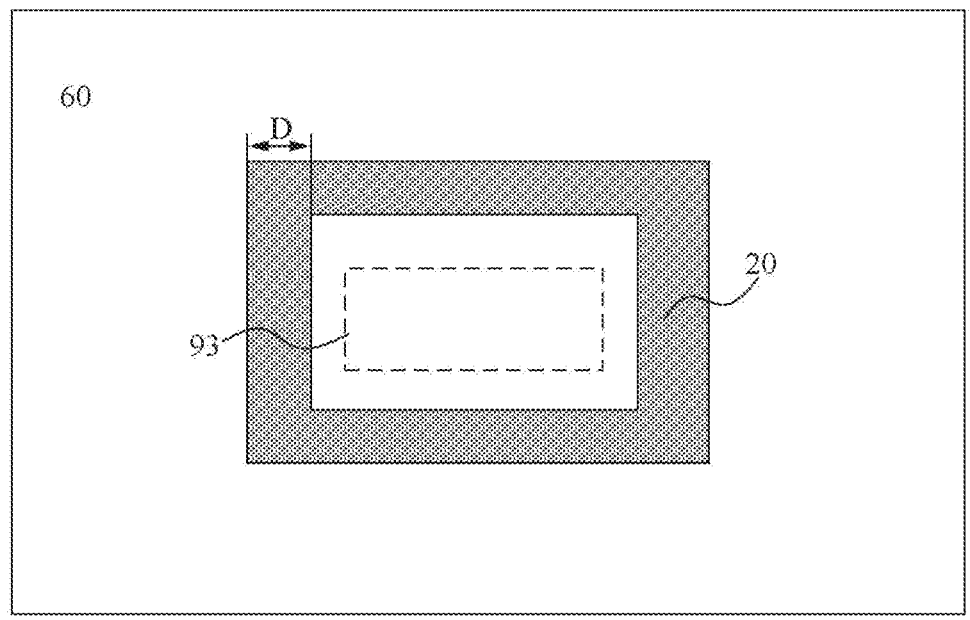
FIG. 3 is a schematic structural diagram of a planarization layer of another bottom emission type array substrate according to an embodiment of the present disclosure.

Further, to maximally block light from being incident upon the active layer of the driving transistor, in the present disclosure, for example, as shown in FIG. 3, the recessed portion 10 is arranged on four sides of the planarization layer 60 facing to the active layer 93 of the driving transistor 90. In some embodiment, the recessed portion 10 is of a ring shape, a projection of the recessed portion 10 on the substrate 100 at least surrounding a projection of the active layer 90 on the substrate 100.

Understandably, in this case, generally, for example, referring to FIG. 3, the recessed portion 10 may integrally form an enclosed annular groove. The groove width D of the enclosed annular groove may be set to 2 μm to 5 μm.

Specifically, if the groove width D of the enclosed annular groove is less than 2 μm, on one hand, this poses higher process requirements, and on the other hand, this easily causes filling abnormality, which cannot effectively ensure efficient light absorption of the light blocking portion 20 filled into the recessed portion 10. However, if the groove width D of the enclosed annular groove is greater than 5 μm, this inevitably increases the area of the non-open region, which is disadvantageous to the requirement of a display panel for a high aperture ratio. Therefore, for example, the groove width D of the enclosed annular groove generally may be set to 2 μm to 5 μm, for example, it may be 3 μm or 4 μm. Understandably, for different types of display panels, the groove width of the enclosed annular groove may be appropriately adjusted according to actual needs.

In addition, it is to be understood that the driving transistor 90 generally may be a top-gate type transistor or a bottom-gate type transistor. Understandably, since the top gate transistor has a smaller parasitic capacitance, in practice, for example, the driving transistor 90 generally is more inclined to adopt the top-gate type transistor.

For the top-gate type driving transistor 90, in practice, to avoid ambient light having an adverse effect on the threshold voltage of the driving transistor 90 so as to ensure the stability of the driving transistor 90, as shown in FIG. 2, generally, a light blocking pattern 80 (which is more inclined to adopt a metal material generally, such that the objective of light blocking is achieved, and the source and the drain may be connected thereto to implement electrostatic discharge) is provided on a side of the active layer 93 close to the base substrate 100.

In addition, for the top-gate type driving transistor 90, a gate 91 is provided above the active layer, which can exert a certain effect of light blocking on the active layer. A plurality of film layers are provided between a source 94 and a drain 95 and the active layer 93 and are connected by via holes generally. On this basis, for the top-gate type driving transistor 90, for example, the above-mentioned "the recessed portion 10 is arranged on at least one side of the active layer 93" refers to a fact that the recessed portion 10 is arranged on at least one side of the active layer. That is, a light blocking range of the light blocking portion 20 in the recessed portion 10 is appropriately increased, such that partial light can be prevented from being incident upon the active layer from a side surface between the source/drain and the active layer 93, thereby effectively ensuring the stability of the driving transistor.

Understandably, for the bottom-gate type driving transistor, the source and the drain are generally in direct contact with the active layer (the source and the drain directly cover the active layer), and the source and the drain are generally made of metal materials, and have a certain light-blocking property. Therefore, it is desirable enough for the bottom-gate type driving transistor so long as light incident upon the active layer is reduced as much as possible. That is, the recessed portion 10 may be correspondingly disposed on the side surface of the active layer 93, or may be correspondingly disposed on the side surface of the active layer.

Figure 4:
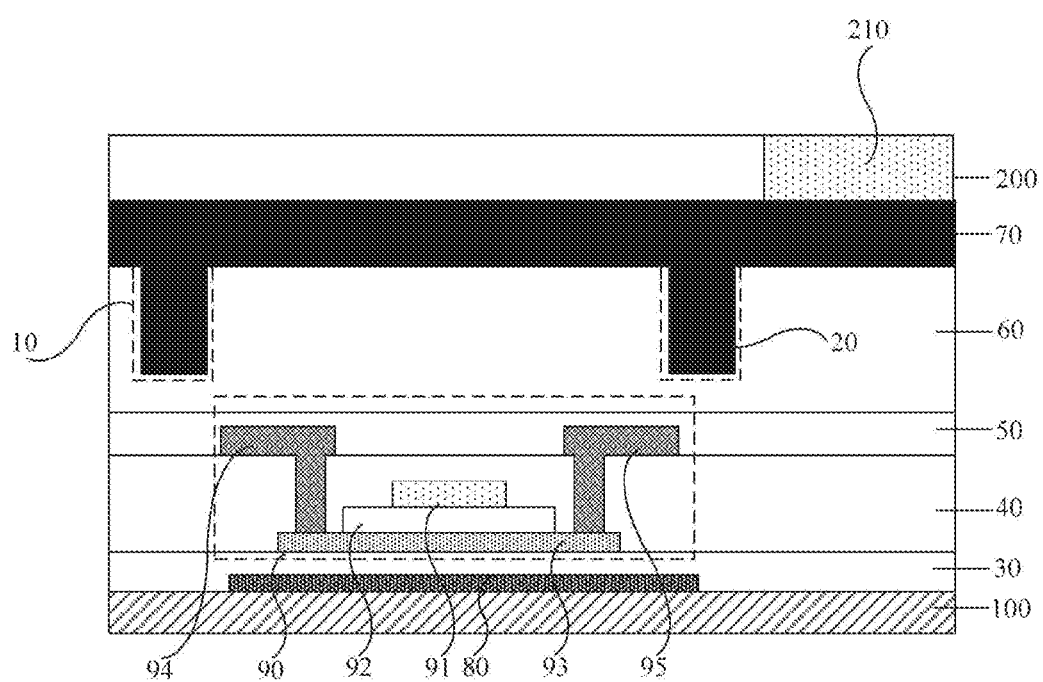
FIG. 4 is a schematic structural diagram of another bottom emission type array substrate according to an embodiment of the present disclosure.

On this basis, it is to be understood that, for the array substrate, the self-light-emitting unit 210 is exemplified as an organic light-emitting diode. As shown in FIG. 4, the array substrate is generally provided with a pixel defining layer 70 on a side of the planarization layer 60 away from the base substrate 100 to define a light emission functional layer 200 of the organic light-emitting diode. The light blocking portion 20 is a portion of the pixel defining layer 70. That is, when the pixel defining layer 70 is formed, the portion of the pixel defining layer 70 filled into the recessed portion 10 constitutes the light blocking portion 20.

It is also to be understood that, in the related art, the pixel defining layer 70 generally is made from an acrylic material or polyimide (PI), etc. That is, the pixel defining layer 70 itself has a certain light absorption property. For example, the pixel defining layer 70 made from the existing PI material has a good absorption of red light and green light.

Understandably, in practice, to ensure the efficient light absorption property of the light blocking portion 20, in general, for example, the light blocking portion may be mainly formed of a black light absorbing material. Understandably, in the case that the light blocking portion 20 is a portion of the pixel defining layer 70, the black light absorbing material may be selected to fabricate the pixel defining layer 70. Specifically, a black acrylic or black polyimide may be formed by adding a black pigment.

In addition, for the above-described recessed portion 10 on the planarization layer 60, in the present disclosure, for example, as shown in FIG. 4, the bottom of the recessed portion 10 does not penetrate through the planarization layer 60.

Specifically, it is to be understood that, in the prior art, the recessed portion 10 is generally formed by an etch process. Therefore, to avoid causing unnecessary damage to film layers below the recessed portion by over etching, the bottom of the recessed portion 10 does not penetrate through the planarization layer 60.

In addition, in practice, based on specific control of the etch process, it may be ensured that the depth of the recessed portion 10 accounts for 80%~95% of the thickness of the planarization layer 60.

Specifically, if the depth of the recessed portion 10 is greater than 95% of the thickness of the planarization layer 60, this poses higher process precision requirements. However, if the depth of the recessed portion 10 is less than 80% of the thickness of the planarization layer 60, there is still a risk that light is incident upon the active layer. Therefore, for example, the depth of the recessed portion 10 is generally set to account for 80%~95% of the thickness of the planarization layer. Schematically, the thickness of the planarization layer 60 generally is 2 μm~3 μm, and the depth of the recessed portion 10 may be 1.5 μm~2 μm.

An embodiment of the present disclosure also provides a display device, which includes the above array substrate having the same structure and beneficial effects as the array substrate provided in the foregoing embodiments. The structure and the beneficial effects of the array substrate have been described in detail in the foregoing embodiments, and thus their details are omitted herein.

It is to be noted that in the embodiments of the present invention, the display device may specifically at least include a display panel, such as an organic light-emitting diode. The display panel may be applied to any product or component having a display function, such as a display, a television, a digital photo frame, a mobile phone, or a tablet computer and so on.

Figure 5:
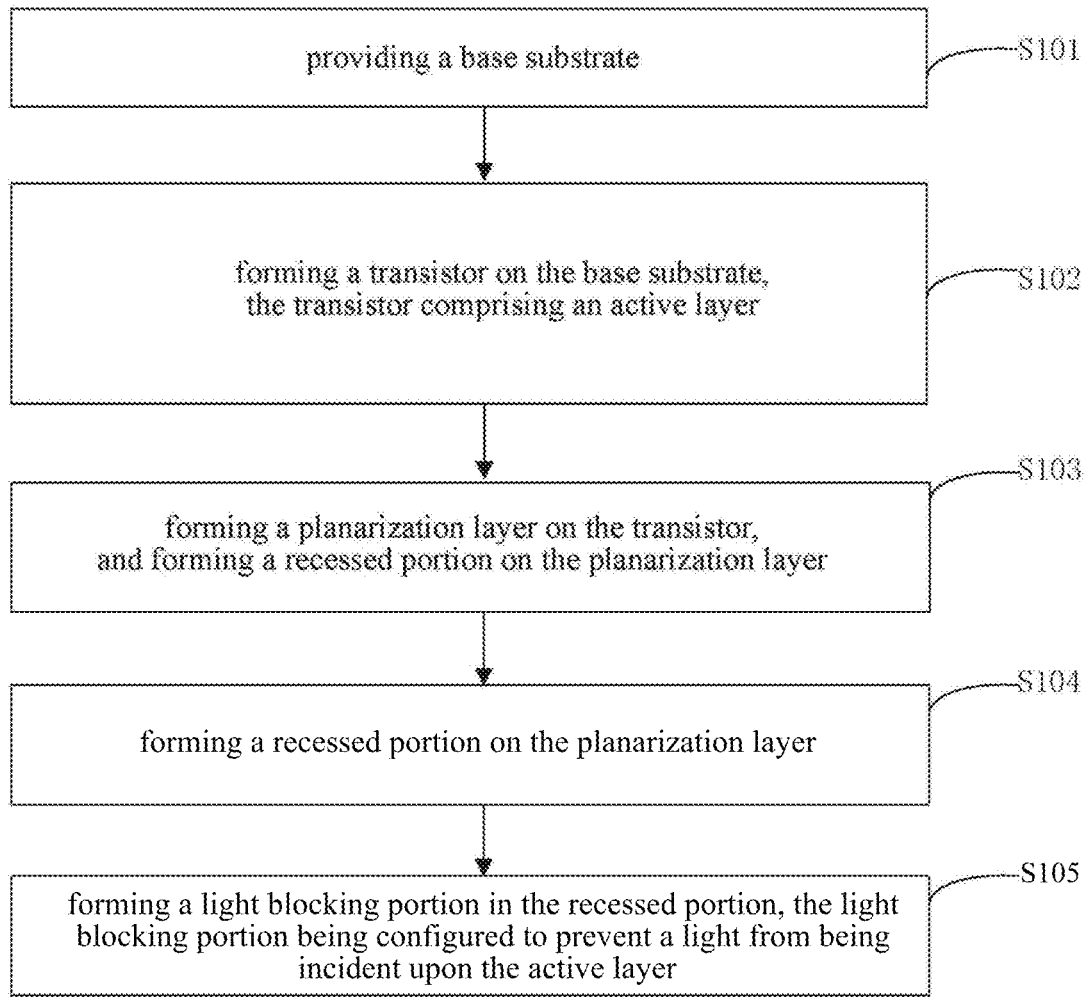
FIG. 5 is a flowchart of a method for fabricating another bottom emission type array substrate according to an embodiment of the present disclosure.

An embodiment of the present disclosure also provides a method for fabricating an array substrate. As shown in FIG. 5, this method includes following steps.

In Step S101, a base substrate 100 is provided.

Figure 6:
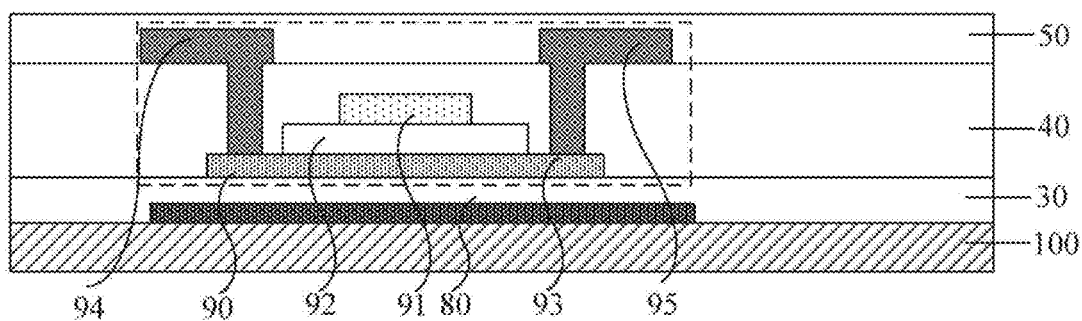
FIG. 6 is a schematic structural diagram in a fabrication process of another bottom emission type array substrate according to an embodiment of the present disclosure.

In Step S102, referring to FIG. 6, a driving transistor 90 is formed on the base substrate 100, and the driving transistor 90 has an active layer 93.

Schematically, an example is taken where the driving transistor 90 is a top-gate type transistor. For a bottom emission type array substrate, this step includes: forming the driving transistor 90 at a location corresponding to the non-open region on the base substrate 100.

Specifically, first, a metal thin film is deposited on the base substrate 100, which may be a molybdenum or molybdenum-niobium thin film, etc., and may have a thickness of 0.1 μm~0.2 μm. A light blocking pattern 80 (for blocking light from below the active layer of the driving transistor 90 from being incident) is formed on the corresponding location of the driving transistor 90 using a patterning process (photolithographic wet etching). To ensure the light blocking effect, a line width of the light blocking pattern 80 is generally set to be 2 μm~3 μm larger than an active layer line width.

Next, a buffer layer 30 (i.e., a 30 fer layer) is further formed, wherein the buffer layer 30 is generally made of silicon oxide and may have a thickness of 0.3 μm~0.5 μm.

Next, an active layer 93, a gate insulation layer 92, a gate 91, an interlayer dielectric layer 40, and a source/drain pattern layer (including the source 94 and the drain 95) of the driving transistor 90 are sequentially formed.

Specifically, the active layer 93 may be formed of indium tin oxide (IGZO) and may have a thickness of 0.05 μm~0.09 μm. The gate insulation layer 92 may be formed of silicon oxide and may have a thickness of 0.1 μm~0.2 μm. The gate 91 may be formed of a metal, such as copper or aluminum, and may have a thickness of 0.5 μm~0.7 μm. The interlayer dielectric layer 40 may be formed of silicon oxide and may have a thickness of 0.3 μm~0.5 μm. The source/drain pattern layer (including the source 94 and the drain 95) may be formed of a metal such as copper or aluminum and may have a thickness of 0.5 μm~0.7 μm.

It is to be noted that for the interlayer dielectric layer 40, a via hole needs to be formed thereon, such that the source and the drain in the source/drain pattern layer are connected to the active layer through the via hole and are connected to the light blocking pattern 80 (for electrostatic discharge). Typically, the via hole is formed on the interlayer dielectric layer 40 using dry etching (generally using a mixed gas of CF4+O2) and wet stripping.

Understandably, after the source/drain pattern layer is formed, a passivation layer 50 having a thickness of about 0.3 μm~0.5 μm is formed generally by using silicon oxide. Understandably, for the array substrate on which a color filter pattern layer needs to be disposed, after the passivation layer 50 is formed, generally, a red filter pattern, a blue filter pattern, and a green filter pattern also need to be formed in corresponding open regions of sub-pixels.

Figure 7:
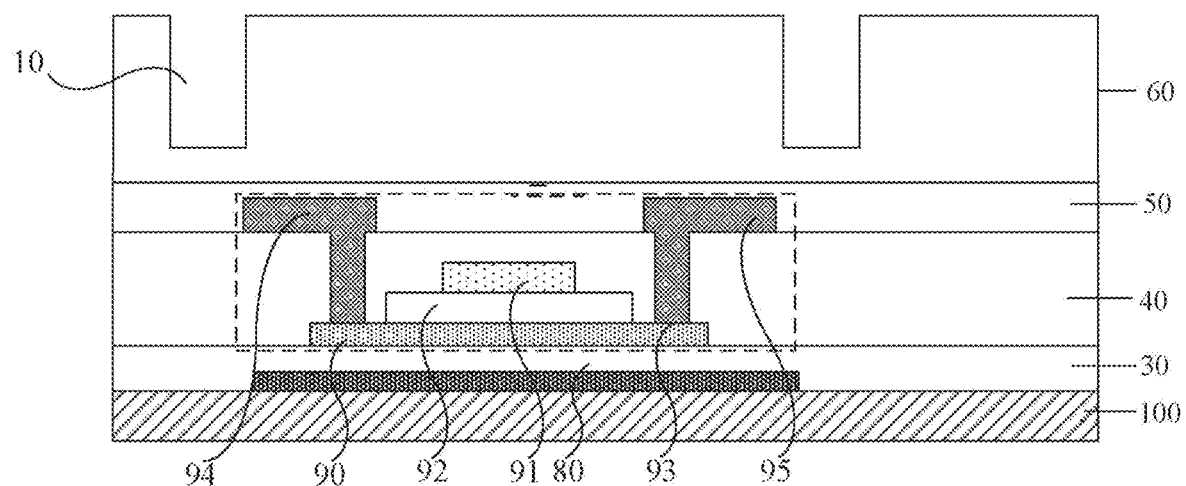
FIG. 7 is a schematic structural diagram in a fabrication process of still another bottom emission type array substrate according to an embodiment of the present disclosure.

In Step S103, referring to FIG. 7, the planarization layer 60 is formed on the base substrate on which the driving transistor 90 is formed. In Step 104, a recessed portion 10 is formed on at least one side of the planarization layer 60 facing to the active layer 93 of the driving transistor 90. In some embodiments, the recessed portion 10 is of a ring shape, where a projection of the recessed portion 10 on the substrate 100 at least surrounds a projection of the active layer 90 on the substrate 100.

On the base substrate on which the driving transistor 90 is formed, at least the driving transistor 90 is formed on the base substrate, and other devices and film layers or the like may be formed thereon, for example, the foregoing passivation layer 50.

As described above, the planarization layer 60 generally is made from a resin material and has a thickness of about 3 μm~4 μm.

In addition, to facilitate the control of degree of etching, generally, the recessed portion 10 is formed on at least one side of the planarization layer 60 facing to the active layer 93 of the driving transistor 90 using a dry etch process, and a mask photoresist PR is formed using wet stripping.

Further, to avoid causing unnecessary damage to film layers below the planarization layer 60 by etching as much as possible, high-oxygen and low-fluorine etching gas (that is, an oxygen content is higher and a fluorine content is lower) is used in the above dry etch process. Specifically, the etching gas used in the dry etch process may be O2; or the etching gas used in the dry etch process may be mixed gas of CF4 and O2, and a volume flow rate of CF4 in the mixed gas is 5%~8% (the volume flow rate of CF4 in the conventional etching gas is above 40%, for example, when the via hole is formed on the foregoing interlayer dielectric layer 40% using the dry etch process).

In Step 105, referring to FIG. 4, the light blocking portion 20 is formed in the recessed portion 10 on the planarization layer 60. In some embodiments, the light blocking portion 20 is of a ring shape, for example, the light blocking portion 20 is of an enclosed annular shape. A projection of the light blocking portion 20 on the substrate 100 at least surrounds a projection of the active layer 90 on the substrate 100.

To simplify the process, the light blocking portion 20 being formed using the process separately is avoided. For example, when the pixel defining layer 70 may be formed on the planarization layer 60, the light blocking portion 20 is directly formed (that is, the portion of the pixel defining layer 70 filled into the recessed portion 10 constitutes the light blocking portion 20). Understandably, for example, the pixel defining layer 70 may be formed using a black light absorbing material.

In addition, in practice, generally the recessed portion 10 is arranged on four sides of the planarization layer 60 corresponding to the active layer 93 of the driving transistor 90. For example, the recessed portion 10 may be the enclosed annular groove as shown in FIG. 3.

Further, a self-light-emitting unit is formed on a side of the planarization layer 60 away from the base substrate 100.

Specifically, for the bottom emission type array substrate, this step includes: forming the self-light-emitting unit at a location corresponding to the open region on the base substrate on which the light blocking portion is formed.

Thus, the light blocking portion positioned in the recessed portion of the planarization layer can block partial light on a side of the planarization layer away from the base substrate from being incident upon the active layer of the driving transistor, thereby reducing instability (such as instability of a threshold voltage, etc.) of the driving transistor caused by an illumination leakage current.

Understandably, reference may be made to the corresponding parts in the foregoing array substrate embodiments for other related contents of the fabrication method, and thus, their details are omitted herein. Reference may be made to the corresponding preparation in the foregoing fabrication method for other structures in the foregoing array substrate embodiments, and corresponding fabrication steps may be adjusted, and thus, their details are omitted herein.

The above-mentioned embodiments are merely specific embodiments of the present disclosure, but the protection scope of the present disclosure is not limited thereto. Any variation or substitution easily conceivable to a person of ordinary skills in the art within the technical scope disclosed in the present disclosure shall fall into the protection scope of the present disclosure. Therefore, the protection scope of the present disclosure shall be subject to the protection scope of the claims.

What is claimed is:

1. An array substrate, comprising:
a base substrate;
a transistor on the base substrate, the transistor comprising an active layer;
a planarization layer on a side of the transistor away from the base substrate;
a recessed portion on the planarization layer, wherein the recessed portion has a ring shape and a projection of the recessed portion on the substrate at least surrounds a projection of the active layer on the substrate; and
a light blocking portion in the recessed portion, the light blocking portion being configured to prevent a light from being incident upon the active layer.

2. The array substrate according to claim 1, wherein the light blocking portion is entirely in the recessed portion.

3. The array substrate according to claim 1, wherein the recessed portion is an enclosed annular groove.

4. The array substrate according to claim 3, wherein a groove width of the enclosed annular groove ranges from 3 μm to 4 μm.

5. The array substrate according to claim 1, wherein the light blocking portion has a ring shape, and a projection of the light blocking portion on the substrate at least surrounds a projection of the active layer on the substrate.

6. The array substrate according to claim 5, wherein the light blocking portion is of an enclosed annular shape.

7. The array substrate according to claim 1, wherein:
the array substrate comprises a plurality of sub-pixels;
at least one of the plurality of sub-pixels comprises an open region and a non-open region on at least one side of the open region; and
the transistor is in the non-open region and the recessed portion is in the non-open region.

8. The array substrate according to claim 7, further comprising a self-light-emitting unit, wherein the self-light-emitting unit is in the open region, the self-light-emitting unit is on a side of the planarization layer away from the base substrate, and a light emission side of the self-light-emitting unit faces to a side of the base substrate.

9. The array substrate according to claim 8, wherein the self-light-emitting unit is an organic light-emitting diode.

10. The array substrate according to claim 9, further comprising a pixel defining layer, wherein the pixel defining layer is on a side of the planarization layer away from the base substrate to define the sub-pixels.

11. The array substrate according to claim 10, wherein a part of the pixel defining layer forms at least a part of the light blocking portion.

12. The array substrate according to claim 1, wherein the light blocking portion is mainly formed of a black light absorbing material.

13. The array substrate according to claim 1, wherein the transistor is a driving transistor.

14. An array substrate, comprising:
a base substrate;
a transistor on the base substrate, the transistor comprising an active layer;
a planarization layer on a side of the transistor away from the base substrate;
a recessed portion on the planarization layer, wherein a bottom of the recessed portion does not penetrate through the planarization layer; and
a light blocking portion in the recessed portion, the light blocking portion being configured to prevent a light from being incident upon the active layer.

15. The array substrate according to claim 14, wherein a depth of the recessed portion accounts for 80%~95% of a thickness of the planarization layer.

16. The array substrate according to claim 1, wherein the array substrate is part of a display device.

17. A method for fabricating an array substrate, comprising:
providing a base substrate;
forming a transistor on the base substrate, the transistor comprising an active layer;
forming a planarization layer on the transistor;
forming a recessed portion on the planarization layer, wherein the recessed portion has a ring shape and a projection of the recessed portion on the substrate at least surrounds a projection of the active layer on the substrate; and
forming a light blocking portion in the recessed portion, the light blocking portion being configured to prevent a light from being incident upon the active layer.

18. The method for fabricating an array substrate according to claim 17, further comprising: forming a self-light-emitting unit on a side of the planarization layer away from the base substrate.

19. The method for fabricating an array substrate according to claim 17, wherein the forming of the recessed portion comprises:
forming the recessed portion on at least one side of the planarization layer facing to the active layer of the transistor through a dry etch process;
wherein etching gas used in the dry etch process is $O_2$; or wherein etching gas used in the dry etch process is mixed gas of $CF_4$ and $O_2$, and a volume flow rate of $CF_4$ in the mixed gas is 5%~8%.

20. The method for fabricating an array substrate according to claim 17, wherein a bottom of the recessed portion does not penetrate through the planarization layer.

* * * * *